US007819995B2

(12) United States Patent
Kim et al.

(10) Patent No.: US 7,819,995 B2
(45) Date of Patent: Oct. 26, 2010

(54) MANUFACTURING METHOD OF MULTI-LAYER CERAMIC SUBSTRATE

(75) Inventors: Yong Suk Kim, Gyunggi-do (KR); Byeung Gyu Chang, Gyunggi-do (KR); Taek Jung Lee, Gyunggi-do (KR)

(73) Assignee: Samsung Electro-Mechanics Co., Ltd., Gyunggi-Do (KR)

( * ) Notice: Subject to any disclaimer, the term of this patent is extended or adjusted under 35 U.S.C. 154(b) by 0 days.

(21) Appl. No.: 12/411,156

(22) Filed: Mar. 25, 2009

(65) Prior Publication Data

US 2010/0051173 A1 Mar. 4, 2010

(30) Foreign Application Priority Data

Aug. 29, 2008 (KR) ..................... 10-2008-0085465

(51) Int. Cl.
*C03B 29/00* (2006.01)
*C04B 33/34* (2006.01)

(52) U.S. Cl. ................................ 156/89.11; 156/89.25

(58) Field of Classification Search ............. 156/89.11, 156/89.12

See application file for complete search history.

(56) References Cited

U.S. PATENT DOCUMENTS 6,350,334 B1 * 2/2002 Shigemi et al. .......... 156/89.12
2003/0000079 A1 * 1/2003 Harada et al. ................. 29/830
2004/0099364 A1 * 5/2004 Suzuki et al. ............ 156/89.11
2004/0211506 A1 10/2004 Wang et al.
2005/0269012 A1 * 12/2005 Saito ....................... 156/89.11
2007/0122999 A1 * 5/2007 Wilmot et al. ............. 438/460
2007/0205695 A1 * 9/2007 Puskas ....................... 310/317
2008/0011507 A1 * 1/2008 Vasoya ....................... 174/260
2008/0283281 A1 * 11/2008 Endou et al. ................ 174/255

FOREIGN PATENT DOCUMENTS

JP 2006-156948 6/2006
JP 2006-351833 12/2006
JP 2007318174 A * 12/2007
KR 10-2006-0016116 A 2/2006

OTHER PUBLICATIONS

Alexy Associates, Inc., "Basics of Ultrasonics", www.aaultrasonic-cleaners.com, Archive.org, Dec. 6, 2006.*

Korean Office Action, with English Translation, issued in Korean Patent Application No. 10-2008-0085465, dated Jun. 22, 2010.

* cited by examiner

*Primary Examiner*—Philip C Tucker
*Assistant Examiner*—Alex Efta
(74) *Attorney, Agent, or Firm*—McDermott Will & Emery LLP

(57) ABSTRACT

There is provided a method of manufacturing a multilayer ceramic substrate, the method including: providing a non-sintered multilayer ceramic substrate having a plurality of low temperature sintering green sheets laminated therein; disposing a hard-to-sinter constraining green sheet on at least one of top and bottom surfaces of the non-sintered multilayer ceramic substrate; sintering the non-sintered multilayer ceramic substrate having the hard-to-sinter constraining layer disposed thereon; immersing the sintered multilayer ceramic substrate into an acidic solution; and activating a contact between the hard-to-sinter constraining layer and the acidic solution such that the hard-to-sinter constraining layer is removed.

5 Claims, 5 Drawing Sheets

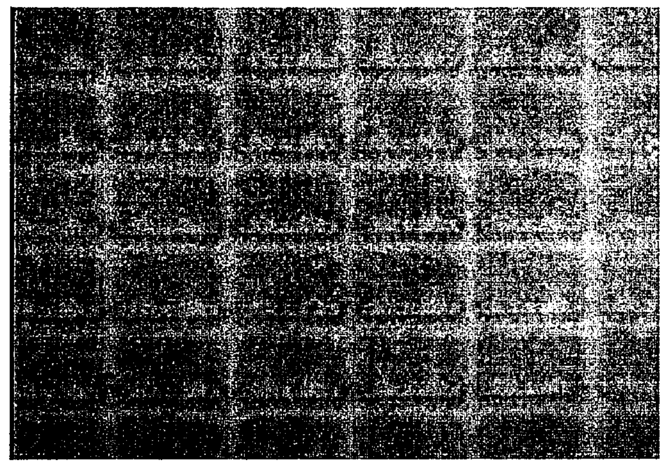
FIG. 2A
FIG. 2B
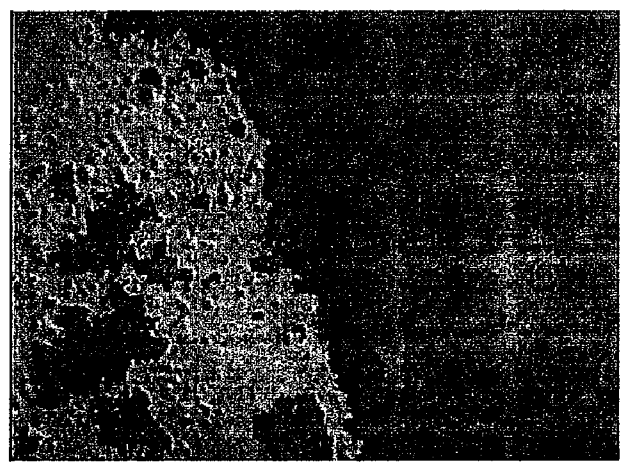
FIG. 2C

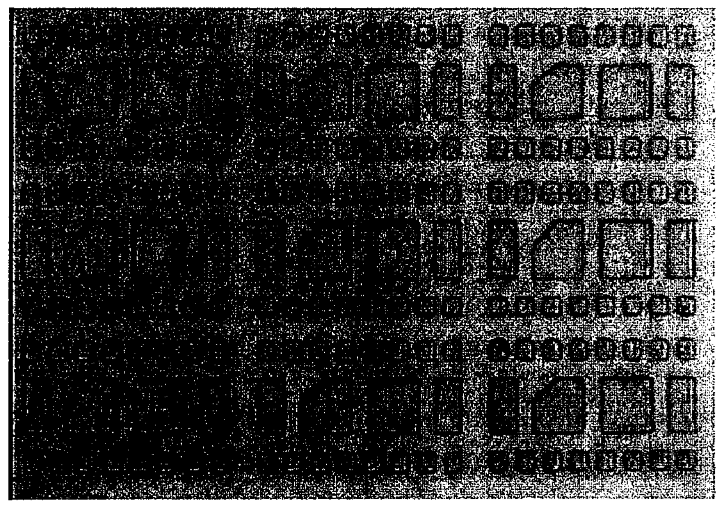
FIG. 3A
FIG. 3B
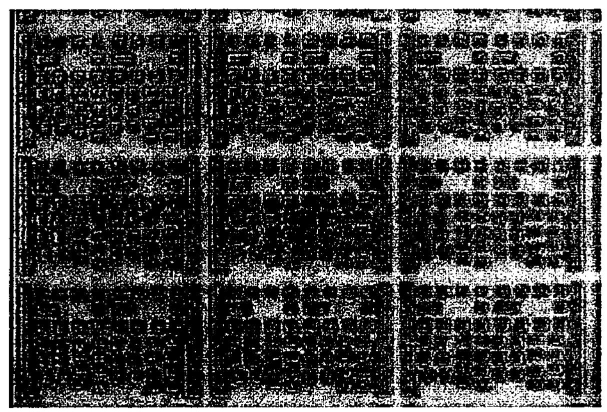
FIG. 3C

MANUFACTURING METHOD OF MULTI-LAYER CERAMIC SUBSTRATE

CROSS-REFERENCE TO RELATED APPLICATIONS

This application claims the priority of Korean Patent Application No. 2008-85465 filed on Aug. 29, 2008, in the Korean Intellectual Property Office, the disclosure of which is incorporated herein by reference.

BACKGROUND OF THE INVENTION

1. Field of the Invention

The present invention relates to a method of manufacturing a multilayer ceramic substrate, and more particularly, to a method of manufacturing a multilayer ceramic substrate in which a hard-to-sinter constraining layer for a constrained sintering process is effectively removed to improve quality of the substrate.

2. Description of the Related Art

In general, a multilayer ceramic substrate using glass-ceramics ensures implementation of a three-dimensional interlayer circuit and formation of a cavity. This allows devices with various functions to be embedded in the multi-layer ceramic substrate, with high flexibility in design.

Accordingly, in the market of smaller and higher-performing high-frequency parts, the multilayer ceramic substrate is increasingly utilized. A multi-layer ceramic substrate in an incipient stage has been manufactured by forming a circuit pattern and a via on a ceramic green sheet as a conductive electrode, arranging and laminating the plurality of green sheets to a desired thickness according to design. In this process, the ceramic substrate shrinks in volume by about 35 to 50%. Particularly, the ceramic substrate shrinks about 12 to 30% in horizontal and vertical lengths, respectively in a transverse direction. This transverse shrinkage can be hardly controlled uniformly. The transverse shrinkage involves an error of 0.5% in respective manufacturing stages and an identical manufacturing stage as well.

With the multilayer ceramic substrate more complicated and precise, inner patterns and via structures have less margin in design and thus constrained sintering is required to suppress transverse shrinkage of the multilayer ceramic substrate.

To this end, a constraining layer made of a hard-to-sinter material such as alumina and barium titanate which is not sintered at a sintering temperature of the ceramic substrate material, is bonded to at least one of two surfaces of the multilayer ceramic substrate in order to suppress shrinkage of the multilayer ceramic substrate in an x-y direction. This hard-to-sinter constraining layer is removed by mechanical machining using e.g., a sandpaper or a polishing process or an ultrasonic device utilizing water and alcohol.

However, the hard-to-sinter constraining layer may not be removed cleanly, thereby hampering a follow-up patterning process.

Notably, even after removal of the constraining layer, a constraining reaction layer formed on a bonding surface by chemical reaction with a composition material of the constraining layer is not removed well by a general method. This leads to plating defects, which subsequently degrade adherence strength in a process such as surface-mount technology (SMT).

SUMMARY OF THE INVENTION

An aspect of the present invention provides a method of manufacturing a multilayer ceramic substrate in which a constraining layer used in constrained sintering and a constraining reaction layer are completely removed without residual dust after sintering to improve plating characteristics and adhesion strength.

According to an aspect of the present invention, there is provided a method of manufacturing a multilayer ceramic substrate, the method including: providing a non-sintered multilayer ceramic substrate having a plurality of low temperature sintering green sheets laminated therein; disposing a hard-to-sinter constraining green sheet on at least one of top and bottom surfaces of the non-sintered multilayer ceramic substrate; sintering the non-sintered multilayer ceramic substrate having the hard-to-sinter constraining layer disposed thereon; immersing the sintered multilayer ceramic substrate into an acidic solution; and activating a contact between the hard-to-sinter constraining layer and the acidic solution such that the hard-to-sinter constraining layer is removed.

The hard-to-sinter constraining layer may include a graphite powder as a main material and has a silicon carbide powder and pyrolic boron nitride added thereto.

The hard-to-sinter constraining layer may further include an $MoS_2$ powder.

The acidic solution may include a combination of a nitride acid, a hydrofluoric acid or a mixture thereof with a neutral solvent.

The activating may be performed by a bubble generator.

The acidic solution may be accommodated in a bath where the bubble generator is installed.

BRIEF DESCRIPTION OF THE DRAWINGS

The above and other aspects, features and other advantages of the present invention will be more clearly understood from the following detailed description taken in conjunction with the accompanying drawings, in which:

FIG. 2A is an optical microscopic picture illustrating a surface where a constraining layer is removed in a multilayer ceramic circuit board manufactured according to Inventive Example;

FIGS. 2B and 2C are optical microscopic pictures illustrating a surface where a constraining layer is removed in a multilayer ceramic circuit board manufactured according to Comparative Examples, respectively;

FIG. 3A is an optical microscopic picture illustrating a plating layer formed on an external conductor pattern of a multilayer ceramic circuit board manufactured according to Inventive Example; and FIGS. 3B and 3C are optical microscopic pictures illustrating a plating layer formed on an external conductor pattern of a multilayer ceramic circuit board manufactured according to Comparative Examples, respectively.

DETAILED DESCRIPTION OF THE PREFERRED EMBODIMENT

Exemplary embodiments of the present invention will now be described in detail with reference to the accompanying drawings.

FIGS. 1A to 1E are procedural cross-sectional views illustrating a method of manufacturing a multilayer ceramic circuit board according to an exemplary embodiment of the invention.

Figure 1A:
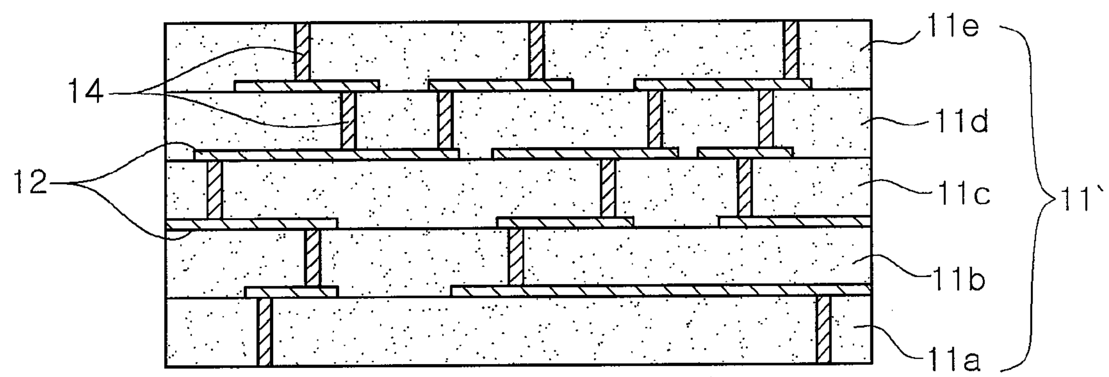
FIGS. 1A to 1E are procedural cross-sectional views illustrating a method of manufacturing a multilayer ceramic circuit board according to an exemplary embodiment of the invention.

First, as shown in FIG. 1A, a non-sintered multilayer ceramic substrate 11' having a plurality of low-temperature ceramic green sheets 1*a* to 11*e* laminated therein is provided.

Each of the ceramic green sheets 11*a* to 11*e* includes a low-temperature sinterable glass-ceramic powder and an organic material such as an organic binder. The each of the green sheets 11*a* to 11*e* includes an electrode pattern 12 and a conductive via hole 14 for forming an inter-layer circuit. The green sheets 11*a* to 11*e* are laminated to produce the non-sintered multilayer ceramic substrate 11' as shown in FIG. 1A.

Figure 1B:
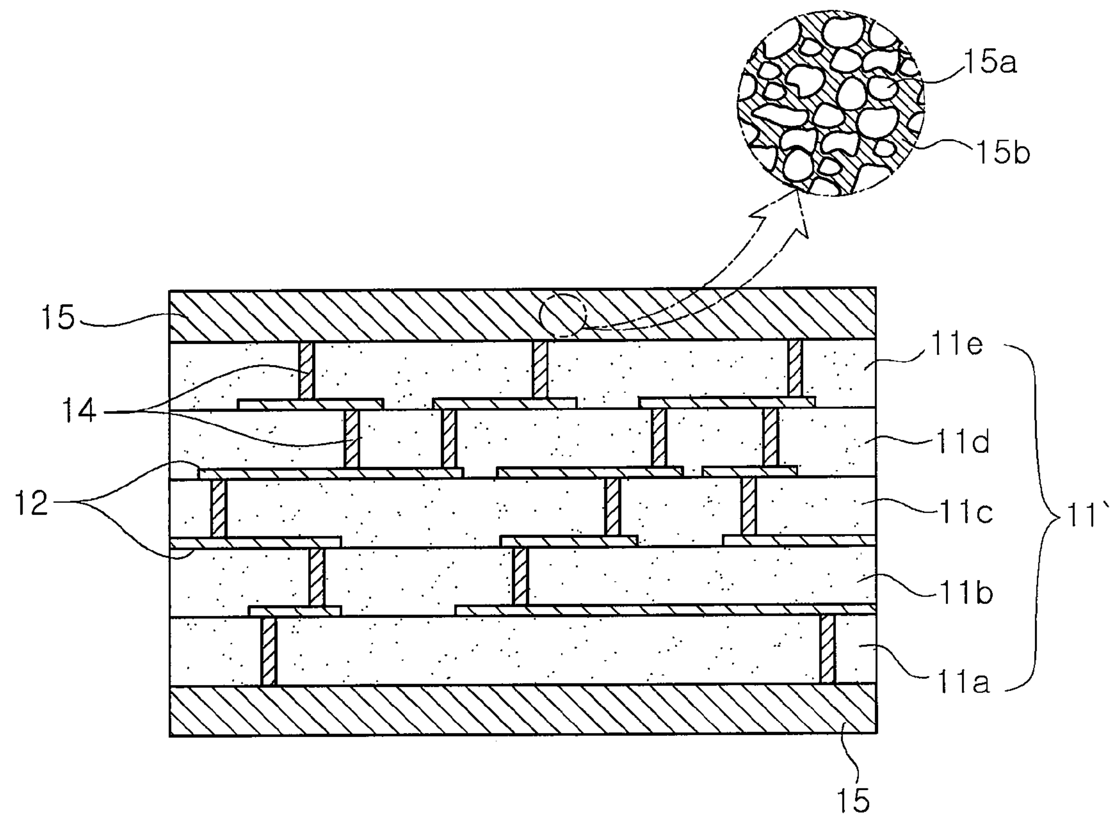

Next, as shown in FIG. 1B, hard-to-sinter constraining layers 15 are disposed on top and bottom surfaces of the non-sintered multilayer ceramic substrate 11'.

Generally, the constraining layer 15 can be provided on one of the top and bottoms surfaces of the ceramic substrate 11' but may be disposed on both the top and bottom surfaces to ensure less shrinkage effectively.

Each of the constraining layers 15 includes an inorganic powder 15*a* and an organic binder 15*b*. The inorganic powder of the constraining layer does not employ alumina ($Al_2O_3$) or barium titanate ($BaTiO_3$) which has been mainly used conventionally. The inorganic powder of the constraining layer may utilize a graphite powder or a mixed power having a graphite powder used as a main composition and a silicon carbide powder and pyrolic boron nitrite (PBN) added thereto. This hard-to-sinter inorganic powder can be easily removed under conditions (FIG. 1D) of the present invention and can be solidly bonded to the ceramic substrate to assure a sufficient constraining force. Particularly, the inorganic powder of the constraining layer may further include an $MoS_2$ powder to increase a constraining force and additionally adjust a sintering initiation temperature.

Figure 1C:
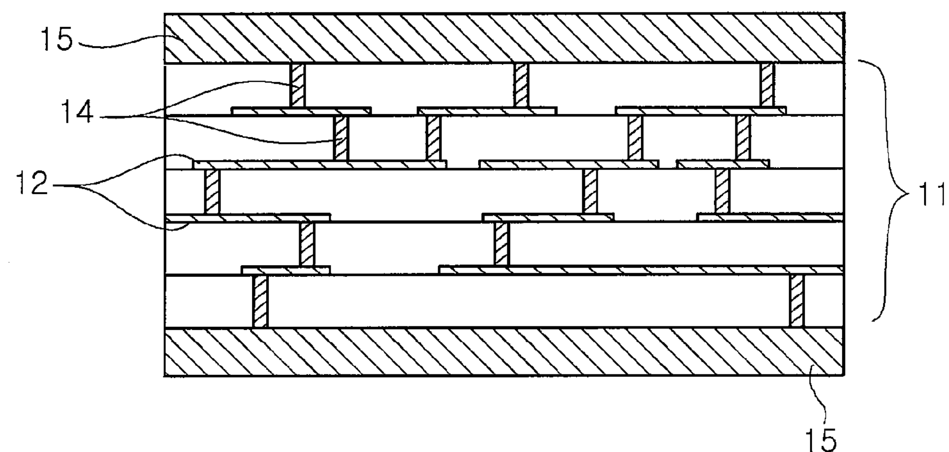

Thereafter, the non-sintered multilayer ceramic substrate 11' having the hard-to-sinter constraining layers disposed on the top and bottom surfaces thereof is sintered to produce a desired sintered multilayer ceramic substrate 11 as shown in FIG. 1C.

The sintered multilayer ceramic substrate 11 shrinks in a thickness direction but can be suppressed from shrinking in a plane direction, i.e., horizontal direction due to the constraining layer 15. As described above, the multilayer ceramic substrate 11 is restrained from shrinking in a plane direction owing to a greater number of contact points resulting from the hard-to-sinter powder of the constraining layer 15*a*.

Figure 1D:
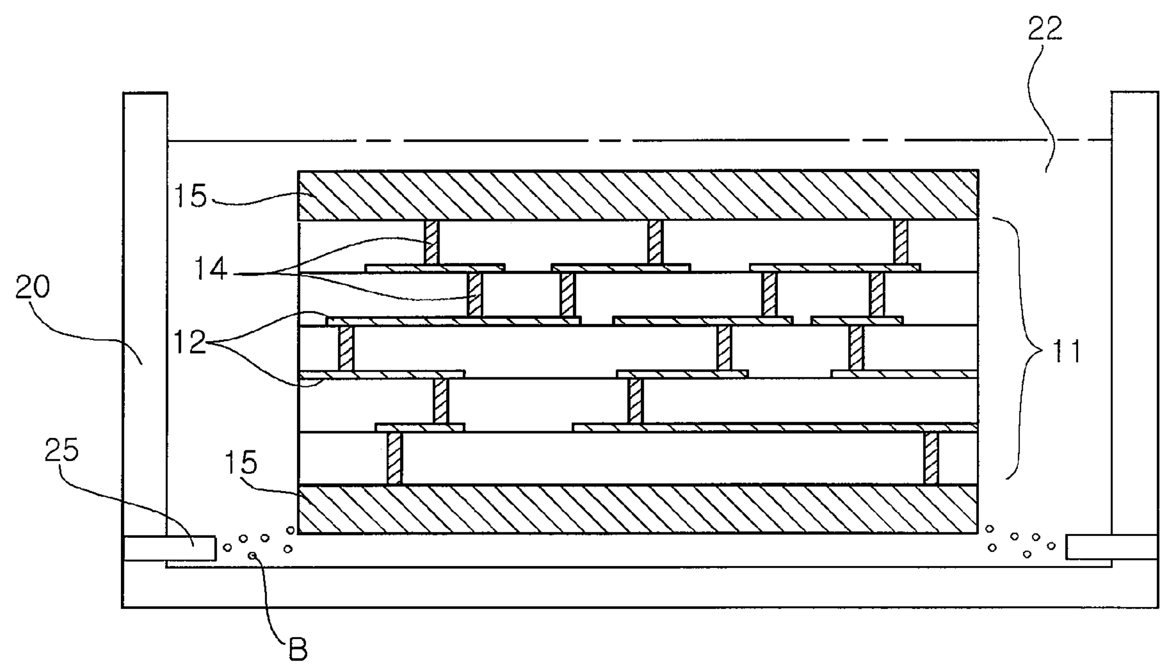
Figure 1E:
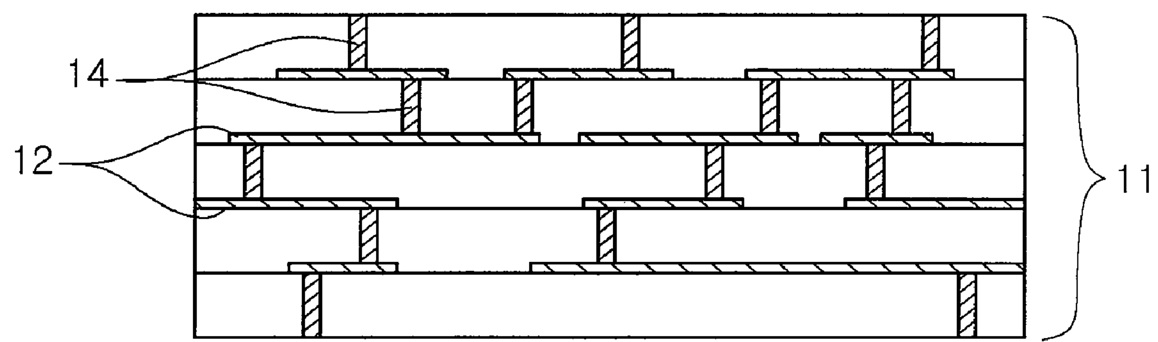

As shown in FIG. 1D, the sintered multilayer ceramic substrate 11 is immersed in an acidic solution 22 to remove the hard-to-sinter constraining layer 15 from the sintered multilayer ceramic substrate 11.

In this process, the acidic solution is accommodated in a bath 20 and a multilayer ceramic substrate 11 having the constraining layers 15 formed on the top and bottom surfaces thereof is immersed in the acidic solution. To obtain the acidic solution, a nitric acid, a hydrofluoric acid or a mixture thereof is mixed with a neutral solvent such as water and alcohol. Thereafter, to ensure the constraining layer 15 is removed more easily, a contact between the constraining layer 15 and the acidic solution 22 is activated. Here, activating a contact does not denote a natural contact in a static state but generating mechanical vibration on a surface of the constraining layer so that a friction with the acidic solution is active.

This vibration generating device may utilize an expensive ultrasonic device, but in the present invention, may employ a simple and cheap bubble generator 25. This bubble generator 25 is installed at a proper location of the bath 20 to generate bubbles B. These bubbles B serve to activate a contact of the acidic solution 22 with a surface of the constraining layer 15.

As a result, this allows the constraining layer to be easily removed using the acidic solution and the bubble generator, thus producing a multilayer ceramic substrate having a surface where the constraining layer is completely removed without residual dust. Particularly, when forming the constraining layer and removing the constraining layer as described above, a constraining reaction layer formed at an interface between the constraining layer and the ceramic substrate is thoroughly removed during sintering, thereby ensuring superior plating characteristics in a follow-up plating process.

This will be described in greater detail by way of examples below.

Inventive Example

To fabricate a constraining layer under conditions of the present invention, a mixed powder having a graphite powder, a silicon carbide powder and pyrolic boron nitride (PBN) was added at about 65 wt %. An acrylic binder of 15 wt %, a dispersant of 0.5 wt % and a mixed solvent of toluene and ethanol were added and then dispersed using a ball mill to produce a slurry. The slurry was filtered and deareated and a constraining layer having a thickness of 100 μm was formed using doctor blading.

A non-sintered multilayer ceramic substrate was provided and the constraining layer was disposed and compressed under a proper pressure on each of top and bottom surfaces thereof. Thereafter, sintering was performed for 30 to 60 minutes at a temperature of 850 to 870° C. To remove the constraining layers formed on the top and bottom surfaces of the sintered ceramic substrate, a nitric acid of 10 wt % and a hydrofluoric acid of 45 wt % were mixed into water which is a neutral solvent to prepare an acidic solution for removing the constraining layers. This acidic solution was provided to a bath where an ozone $O_3$ bubble generator was installed. With the sintered substrate immersed in the acidic solution of the bath, bubbles were generated to activate friction and the constraining layers were removed.

Comparative Examples 1 and 2

Comparative Examples 1 and 2 were prepared for comparative test. According to Comparative Examples 1 and 2, respectively, to fabricate a constraining layer, an alumina ($Al_2O_3$) powder was added at about 65 wt %. Also, an acrylic binder of 15 wt %, a dispersant of 0.5 wt %, and a mixed solvent of toluene and ethanol were added and then dispersed using a ball mill to produce a slurry. The slurry was filtered and deareated and constraining layers each having a thickness of 100 μm were formed using doctor blading.

Afterwards, similarly to the Inventive Example, a non-sintered multilayer ceramic substrate was provided and the constraining layers were disposed and compressed on top and bottom surfaces of the non-sintered multilayer ceramic substrate. Subsequently, sintering was performed for 30 to 60 minutes at a temperature of 850 to 870° C. To remove the constraining layers formed on the top and bottom surfaces of the sintered ceramic substrate, an ultrasonic device was employed. In Comparative Example 1, water was used as a medium and in Comparative Example 2, alcohol was used as a medium.

FIGS. 2A to 2C are optical microscopic pictures illustrating a surface of the resultant product.

According to the Inventive Example of the present invention, as shown in FIG. 2A, dusts are almost fully removed to clearly reveal a circuit pattern. In contrast, referring to FIGS. 2B and 2C, in the multilayer ceramic substrate where the constraining layers are removed according to Comparative Examples 1 and 2, respectively, the constraining layers are not removed over a wide area of a surface but residuals of the constraining layers partially remain.

Thereafter, the circuit pattern of each of the multilayer ceramic substrates according to Inventive Example and Comparative Examples 1 and 2 was subjected to plating. When residuals remain as in Comparative Examples 1 and 2, the process of removing the constraining layers was additionally conducted over a long time until the residuals were removed and plating was performed.

According to the Inventive Example, as shown in FIG. 3A, the circuit pattern was observed to be plated clearly according to a conductor pattern. On the contrary, as for a plating layer of each of the multilayer ceramic substrates according to Comparative Examples 1 and 2, as shown in FIGS. 2B and 2C, a plated portion was partially diffused or a non-plated portion was observed.

As described above, in removing the constraining layers, plating defects such as plating diffusion or non-plating occur because the constraining reaction layer has not been fully removed. However, as shown in FIG. 3A, in a case where the constraining layer is provided and removed under the condition of the present invention, even a constraining reaction layer is completely removed to ensure superior plating characteristics.

This difference in plating conditions results from a difference in adhesion strength in case of a surface-mount technology (SMT) process. Table 1 below shows measurement results of adhesion strength for 12 samples prepared according to the Inventive Example and Comparative Examples 1 and 2, respectively.

TABLE 1

| Samples | Inventive Ex. | Comparative Ex. 1 | Comparative Ex. 2 |
|---|---|---|---|
| 1 | 37.1 | 15.5 | 20.3 |
| 2 | 39.6 | 12.0 | 21.0 |
| 3 | 35.2 | 12.0 | 19.4 |
| 4 | 37.7 | 13.3 | 23.4 |
| 5 | 33.6 | 15.6 | 19.4 |
| 6 | 41.7 | 18.1 | 20.1 |
| 7 | 36.9 | 13.3 | 28.7 |
| 8 | 40.4 | 15.2 | 21.9 |
| 9 | 34.2 | 13.8 | 20.6 |
| 10 | 36.7 | 17.1 | 23.5 |
| 11 | 36.8 | 13.5 | 21.0 |
| 12 | 37.5 | 14.7 | 18.3 |
| AAS* | 37.3 | 14.5 | 21.5 |
| AV* | 2.39 | 1.89 | 2.75 |

Notes)
AAS* denotes average adhesion strength and AV* denotes average variation.

As shown in Table 1, in a case where the constraining layer is removed using an acidic solution as in the Inventive Example, superior adhesion strength is assured, that is, 2.5 times higher than in a case where water is employed according to Comparative Example 1 and 1.7 times higher than in a case where alcohol is employed. This higher adhesion strength ensures better reliability in terms of drop and thermal impact and also saves costs through higher yield in the case of mass production.

As set forth above, according to exemplary embodiments of the invention, unlike a conventional mechanical machining process such as surface polishing which has problems due to removal of a non-constraining layer and tedious process time, a method of manufacturing a multilayer ceramic substrate allows a constraining layer to be removed effectively in a short time. Particularly, the manufacturing method solves plating defects such as plating diffusion and non-plating which occur in the conventional method employing only water or alcohol, thereby guaranteeing superb plating characteristics in forming fine patterns. The manufacturing method ensures superior plating characteristics and thus significantly improves adhesion strength.

While the present invention has been shown and described in connection with the exemplary embodiments, it will be apparent to those skilled in the art that modifications and variations can be made without departing from the spirit and scope of the invention as defined by the appended claims.

What is claimed is:

1. A method of manufacturing a multilayer ceramic substrate, the method comprising:

providing a non-sintered multilayer ceramic substrate having a plurality of low temperature sintering green sheets laminated therein;

disposing a hard-to-sinter constraining green sheet on at least one of top and bottom surfaces of the non-sintered multilayer ceramic substrate;

sintering the non-sintered multilayer ceramic substrate having the hard-to-sinter constraining layer disposed thereon;

immersing the sintered multilayer ceramic substrate into an acidic solution; and activating a contact between the hard-to-sinter constraining layer and the acidic solution such that the hard-to-sinter constraining layer is removed, wherein the hard-to-sinter constraining layer comprises a graphite powder as a main material and has a silicon carbide powder and pyrolytic boron nitride added thereto.

2. The method of claim 1, wherein the hard-to-sinter constraining layer further comprises an $MoS_2$ powder.

3. The method of claim 1, wherein the acidic solution comprises a combination of a nitric acid, a hydrofluoric acid or a mixture thereof with a neutral solvent.

4. The method of claim 1, wherein the activating is performed by a bubble generator.

5. The method of claim 4, wherein the acidic solution is accommodated in a bath where the bubble generator is installed.

* * * * *